United States Patent
Mazure et al.

(10) Patent No.: US 9,496,877 B2
(45) Date of Patent: Nov. 15, 2016

(54) PSEUDO-INVERTER CIRCUIT WITH MULTIPLE INDEPENDENT GATE TRANSISTORS

(75) Inventors: Carlos Mazure, Bernin (FR); Richard Ferrant, Esquibien (FR); Bich-Yen Nguyen, Austin, TX (US)

(73) Assignee: Soitec, Bernin (FR)

( * ) Notice: Subject to any disclaimer, the term of this patent is extended or adjusted under 35 U.S.C. 154(b) by 438 days.

(21) Appl. No.: 14/346,270

(22) PCT Filed: Sep. 30, 2011

(86) PCT No.: PCT/IB2011/002823
§ 371 (c)(1),
(2), (4) Date: Mar. 20, 2014

(87) PCT Pub. No.: WO2013/045970
PCT Pub. Date: Apr. 4, 2013

(65) Prior Publication Data
US 2014/0225648 A1    Aug. 14, 2014

(51) Int. Cl.
*H03K 19/20* (2006.01)
*G11C 8/08* (2006.01)
*G11C 11/408* (2006.01)

(52) U.S. Cl.
CPC ............. *H03K 19/20* (2013.01); *G11C 8/08* (2013.01); *G11C 11/4085* (2013.01)

(58) Field of Classification Search
CPC ......... G11C 16/08; G11C 16/10; G11C 8/08; G11C 8/10; G11C 16/0483; G11C 11/412; H01L 27/1203; H01L 27/115; H03K 17/302; H03K 19/20; H03K 2217/0018

USPC ........... 326/37, 38, 101–104, 112, 119, 121, 326/82–87

See application file for complete search history.

(56) References Cited

U.S. PATENT DOCUMENTS

| | | | |
|---|---|---|---|
| 2003/0151077 A1 | 8/2003 | Mathew et al. | |
| 2007/0013413 A1* | 1/2007 | Chiang et al. | 326/121 |
| 2007/0109906 A1 | 5/2007 | Leung | |
| 2007/0262793 A1* | 11/2007 | Kapoor | 326/101 |
| 2009/0016106 A1* | 1/2009 | Tran et al. | 365/185.05 |
| 2009/0175081 A1* | 7/2009 | Kim | 365/185.11 |
| 2009/0278570 A1 | 11/2009 | Kapoor | |
| 2010/0026346 A1 | 2/2010 | Chiang et al. | |
| 2010/0315128 A1 | 12/2010 | Kapoor | |

OTHER PUBLICATIONS

International Search Report, PCT/IB2011/002823, mailed Jul. 24, 2012.

* cited by examiner

*Primary Examiner* — Jany Richardson
(74) *Attorney, Agent, or Firm* — Jeffrey T. Holman

(57) ABSTRACT

The invention relates to a circuit including a transistor of a first type of channel in series with a transistor of a second type of channel between first and second terminals for applying a power supply potential, each of the transistors being a multiple gate transistor having at least a first ($G_{1P}$, $G_{1N}$) and a second ($G_{2P}$, $G_{2N}$) independent control gates, characterized in that at least one of the transistors is configured for operating in a depletion mode under the action of a second gate signal applied to its second control gate ($G_{2P}$, $G_{2N}$).

17 Claims, 6 Drawing Sheets

PSEUDO-INVERTER CIRCUIT WITH MULTIPLE INDEPENDENT GATE TRANSISTORS

This application is a 371 filing of International Patent Application PCT/IB2011/002823 filed Sep. 30, 2011.

FIELD OF THE INVENTION

The field of the invention is that of semiconductor devices, in particular those made on a semiconductor-on-insulator substrate (SeOI substrate) comprising a thin layer of semiconducting material separated from a base substrate by an insulating layer.

The invention more specifically relates to a pseudo-inverter SeOI circuit which, depending on the inputs which are applied to it, may provide the logic INV (inversion), NOR and NAND functions, so that the whole of the standard library of CMOS cells may be described on the basis of a single circuit of the invention.

A preferential application of the invention relates to the making of a wordline driver circuit for a network of memory cells.

BACKGROUND OF THE INVENTION

A conventional DRAM (Dynamic Random Access Memory) memory cell is formed by associating a transistor and a capacitance for storing charges. More recently, a DRAM memory cell only consisting of one transistor has been proposed. This cell utilizes a floating channel effect for storing charges and does not require any additional capacitance.

Memory cells are conventionally laid out in a memory array so that the gates of the transistors of the cells laid out along a line of the memory array share a wordline, while the sources of the transistors of the cells laid out along a column of the memory array share a bitline. The stored datum in a memory cell may be accessed by means of a single row address represented by the wordline and of a single column address represented by the bitline.

Each wordline is controlled via a wordline driver circuit, which is itself driven by a row address decoder.

In practice, the access transistor in the DRAM memory cell must have a very low leakage to sustain the information as long as possible. Its threshold voltage should thus be relatively high. This implies that a relatively large voltage has to be applied on the gate in order to make it conducting. It will be noted that the voltage of the wordline should also take into account the source-dependent change in the threshold voltage of the transistor of the memory cell known as "body effect". The wordline driving the gate of the transistor should thus deliver a voltage which is typically 1.5 to 2 times higher than the nominal voltage.

Conventional wordline driver circuits are thus relatively bulky notably relatively to the size of a memory cell, which generally causes integration problems (notably the requirement for resorting to a stacking technique, a so-called "staggering" technique, for several driver circuits behind each other in order to address several adjacent lines of memory cells).

In FIG. 1, a wordline driver circuit 300 according to the state of the art is illustrated, as described in document US 2007/0109906.

The driver circuit 300 addresses a line of memory cells 100 via the wordline WL. All the nodes of the circuit 300 have a high voltage, except for the input signals Yi and Yi# from the line address decoder 330. The transistors of the driver circuit 300 thus have to support high voltages, notably the transistors 303 and 313.

By taking into account the different interconnections, the Applicant was able to estimate that the area of the driver circuit 300 of FIG. 1 corresponds to about 6 times that of transistor 303. Circuit 300 therefore proves to be particularly area consuming, notably as compared with the area of a memory cell formed with a single transistor.

The staggering of several driver circuits 300 behind each other then proves to be necessary in order to take into account the pitch difference.

A simpler wordline driver circuit is illustrated in FIGS. 2a and 2b. FIG. 2a illustrates the logic functions provided by this circuit, while FIG. 2b illustrates a possible embodiment thereof.

It will first of all be noted that this circuit includes two logic NOR gates 2, 3 in parallel, having a common input MWL# and having as another input, a single signal A or its complementary A#. The outputs are formed by local wordlines $LWL_E$ and $LWL_O$.

It will then be noted that unlike the circuit of FIG. 1, the circuit of FIGS. 2a and 2b is supplied with a high voltage main wordline signal MWL# provided by a line address decoder 1. The result is more (about two to four times more) significant power consumption than for the circuit of FIG. 1.

An estimation made by the Applicant of the size of each of the transistors relatively to the reference $W_{303}$ designating the width of the transistor 303 of FIG. 1 is reported on FIG. 2b. The result is that the total size is of the order of $6W_{303}$. Thus, the circuit of FIGS. 2a and 2b proves to be actually simpler than that of FIG. 1, nevertheless it remains area consuming.

SHORT DESCRIPTION OF THE INVENTION

A first object of the invention is to propose a circuit which does not have the drawbacks mentioned earlier, in particular a relatively not very bulky, low consumption circuit, which may be used as a wordline driver circuit in a memory array.

Another object of the invention is to propose a particularly simple and not very bulky circuit which may be used for providing different logic functions.

In this context, the invention according to a first aspect, proposes a circuit including a transistor of a first type of channel in series with a transistor of a second type of channel between first and second terminals for applying a power supply potential, each of the transistors being a multiple gate transistor having at least a first and a second independent control gates arranged laterally each one on one side of the channel region of the transistor, characterized in that at least one of the transistors is configured for operating in a depletion mode under the action of a second gate signal applied to its second control gate ($G_{2P}$, $G_{2N}$)

Certain preferred but non-limiting aspects of this device are the following:

the second control gates are biased by a same second gate signal and the first or the second terminal for application of a power supply potential is biased by the complementary signal of said second gate signal;

when the first terminal for application of a power supply potential is biased by the complementary signal of said second gate signal, the second terminal for application of a power supply potential is biased at a OFF state;

the transistor of the second type of channel is configured in order to operate in a depletion mode when the second gate signal is in the ON state;

when the second terminal for application of a power supply potential is biased by the complementary signal of said second gate signal, the first terminal for application of a power supply potential is biased to a ON state;

the transistor of the first type of channel is configured in order to operate in a depletion mode when the second gate signal is in the OFF state;

the first terminal for application of a power supply potential is biased at a ON state, whereas the second terminal for application of a power supply potential is biased at a OFF state;

it includes an input node connected to the first control gate of each of the transistors and an output node connected to the middle point of the serial association of the transistors;

the transistors are fully depleted;

the transistors are double independent gate FET transistors which first and second independent gates are arranged laterally each one on one side of the channel region of the transistor;

it is made on a semiconductor-on-insulator substrate comprising a thin layer of semiconducting material separated from a base substrate by a buried insulating layer, and the first gate of each transistor is a front tri-gate surrounding all three sides of the channel of the transistor and the second control gate of each transistor is a back control gate formed in the base substrate below the channel of the transistor and separated from said channel by the buried insulating layer;

transistor of the first type of channel is a double independent gate PFET transistor and the transistor of the second type of channel is a double independent gate NFET transistor;

it is made on a semiconductor-on-insulator substrate comprising a thin layer of semiconducting material separated from a base substrate by a buried insulating layer, and at least one of the multiple gate transistors further comprises a back control gate formed in the base substrate below the channel of the transistor and separated from said channel by the buried insulating layer.

According to a second aspect, the invention relates to a wordline driver circuit comprising at least one pair of circuits according to the first aspect of the invention laid out in parallel, each circuit of the pair being intended to receive an input signal from a row address decoder and providing at the output a signal intended to be used as a local wordline for a plurality of memory cells laid out as a row.

According to another aspect, the invention relates to a system comprising at least one circuit according to the first aspect of the invention and a control circuit designed to modify the inputs provided to said at least one circuit so that the logic function provided by said at least one circuit can be changed in between the logic INV, NOR and NAND functions.

According to still another aspect, the invention relates to a memory incorporating a wordline driver circuit according to the second aspect of the invention.

According to still another aspect, the invention relates to a method for controlling a driver circuit according to the second aspect of the invention, wherein:

in the active mode, the signal for biasing the second gates of the first circuit of a pair of circuits is complementary of the signal for biasing the second gates of the second circuit of the pair of circuits;

in the inactive mode, the first terminal for application of a power supply potential and the signals for biasing the second gates of each of the circuits of the pair are in the OFF state.

SHORT DESCRIPTION OF THE DRAWINGS

Other aspects, objects and advantages of the present invention will become better apparent upon reading the following detailed description of preferred embodiments thereof, given as a non-limiting example, and made with reference to the appended drawings wherein, in addition to FIGS. 1, 2a and 2b on which comments have already been made earlier:

DETAILED DESCRIPTION OF THE INVENTION

The invention according to a first aspect relates to a circuit which according to a preferred embodiment is made on a semiconductor-on-insulator substrate comprising a thin layer of semiconducting material separated from a base substrate by an insulating layer.

The circuit includes a transistor of a first channel type in series with a transistor of a second channel type between a first and a second terminals for application of a power supply potential, each of the transistors comprising a drain region and a source region in the thin layer, a channel extending between the source region and the drain region, and a front control gate located above the channel.

Figure 5:
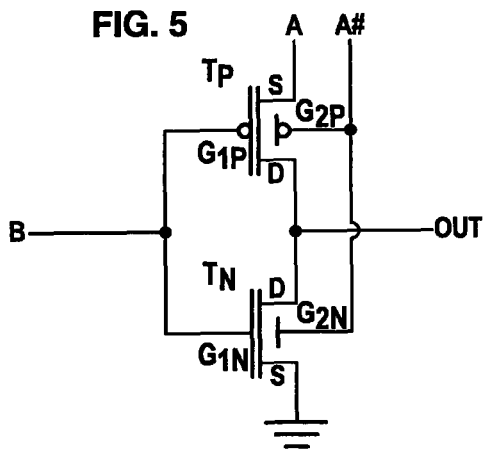
FIG. 5 illustrates a possible embodiment of the circuit according to the first aspect of the invention providing the logic NOR function.
Figure 6:
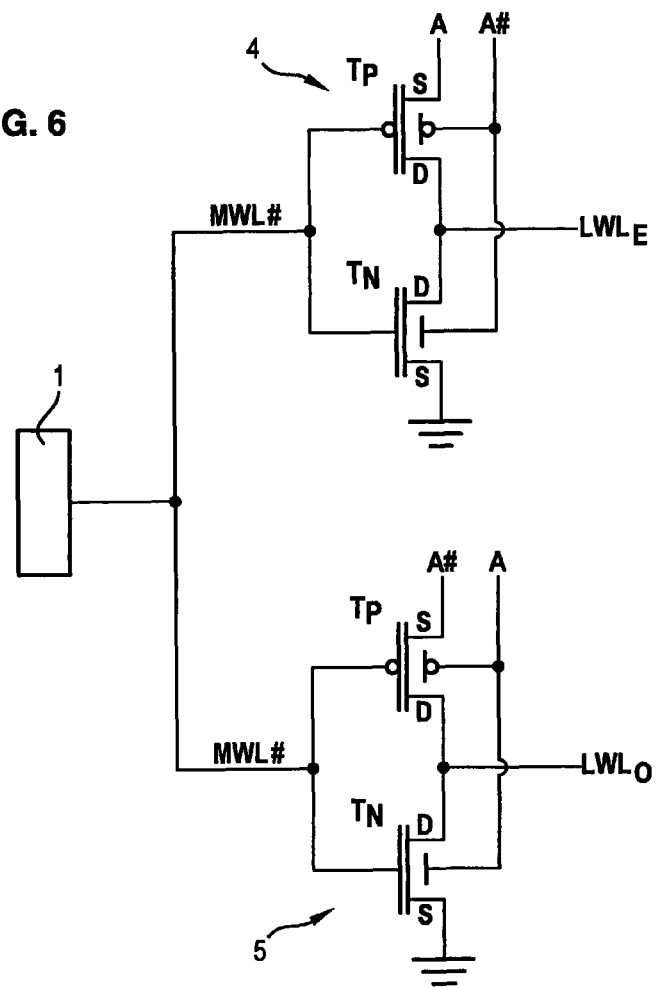
FIG. 6 illustrates a possible embodiment of a wordline driver circuit according to the second aspect of the invention.
Figure 7:
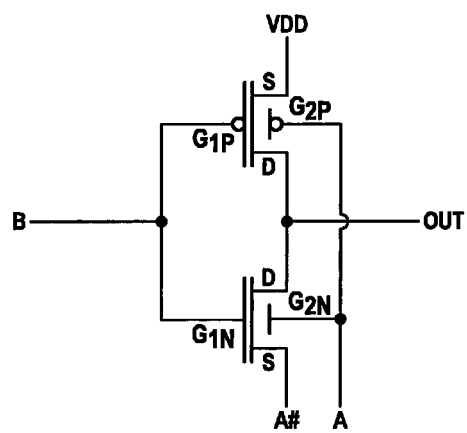
FIG. 7 illustrates a possible embodiment of the circuit according to the first aspect of the invention providing the logic NAND function.

In the embodiment illustrated in FIGS. 5-7, the circuit comprises a P channel transistor $T_P$, the source of which is connected to the first terminal for application of a power supply potential and an N channel transistor $T_N$, the source of which is connected to the second terminal for application of a power supply potential. The transistors $T_P$, $T_N$ are multiple dual gate transistors having at least two independent gates, each of these independent gates being for instance a lateral gate provided on a lateral side of a fin structure which comprises the channel formed in the thin layer of the SeOI substrate and a gate dielectric layer overlying a lateral side of the channel.

The first gates $G_{1P}$, $G_{1N}$ of the transistors $T_P$, $T_N$ of the circuit are connected together and connected to a common input (B in FIGS. 5 and 7, MWL# in FIG. 6). The middle point of the serial association of the transistors $T_P$, $T_N$ forms the output of the circuit (OUT in FIGS. 5 and 7, $LWL_E$ and $LWL_O$ in FIG. 6).

The circuit according to the first aspect of the invention is said to be a pseudo-inverter in that it has the standard structure of a CMOS inverter. However, as this will be described further subsequently, depending on the inputs which are applied on this circuit, the latter may produce other logic functions.

It will be noted that the logic inversion function may moreover be achieved by setting in a standard way the first terminal for application of a power supply potential to the high state VDD and by setting the second terminal for application of a power supply potential to the low state GND.

Within the scope of the invention, each of the transistors has a second control gate $G_{2P}$, $G_{2N}$ capable of being biased for modulating the threshold voltage of the transistor.

Figure 3:
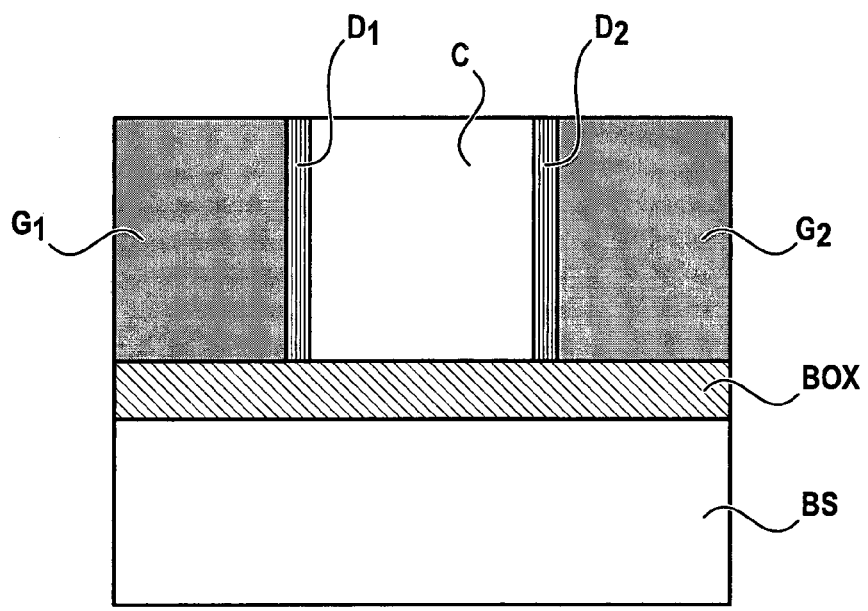
FIG. 3 illustrates an example of a transistor having two independent control gates.

A cross-section of an example double gate transistor is illustrated in FIG. 3. The double gate transistor comprises two independent gate regions G1, G2 each one being provided on a lateral side of a fin structure which comprises the channel C formed in the thin layer of the SeOI substrate and a gate dielectric layer D1, D3 overlying a lateral side of the channel. The channel C is isolated from the base substrate BS by means of the buried insulating layer BOX of the SeOI substrate.

Such a double gate transistor has for instance been described in US 2003/0151077 A1.

The double gate transistors can be symmetric double gate transistors, in that they exhibit for each of the two gate regions equivalent dielectric layer thicknesses and gate work functions along with symmetrical channel doping. The invention also extends to asymmetrical dual gate transistors, the asymmetry resulting from process parameters that modify threshold voltages or device strength and that include a difference in gate dielectric layer thickness, doping of gate region material, or material of different workfunction for the two gate regions, grading of the channel doping between the two gate regions, or introduction of impurities in one of the gate region.

In a specific embodiment, at least one of the multiple gate transistors further comprises a back control gate (a third independent gate, for instance formed by implantation of dopants) formed in the base substrate below the channel of the transistor and separated from said channel by the buried insulating layer.

In other embodiment, at least one the multigate transistors of the circuit according to the first aspect of the invention comprises a front tri-gate surrounding all three sides of the channel and being separated from the channel by a gate dielectric layer formed on top surface and laterally opposite sidewalls of the channel, and a back control gate formed in the base substrate below the channel of the transistor and separated from said channel by the buried insulating layer.

The transistors $T_P$, $T_N$ are preferentially fully depleted SeOI transistors, although the invention also extends to partially depleted transistors. The benefit of having fully depleted transistors is due to the fact that such transistors have very low fluctuation of dopants (RDF: Random Dopant Fluctuation): the nominal threshold voltage is then defined very specifically, as well as the variation of the threshold voltage versus bias of the second control gate.

A transistor for which the channel has N type conductivity and a second control gate of conductivity P has a very high threshold voltage. This threshold voltage may then be reduced by applying a positive voltage on the second control gate. A transistor for which the channel has N type conductivity and a second control gate of conductivity N, as for it, has a nominal threshold voltage which may be reduced by applying a positive voltage on the second control gate.

This variation of the threshold voltage of the transistor via the second control gate may be formulated as $V_{th}=V_{t0}-\alpha\cdot V_{G2}$, wherein $V_{th}$ represents the threshold voltage of the transistor, $V_{G2}$ the voltage applied to the second control gate, $V_{t0}$ the nominal threshold voltage (which may be shifted by the work function depending on whether a second control gate of the N or P type is used), and $\alpha$ is a coefficient related to the geometry of the transistor.

It is therefore understood that the type of doping of the second control gate associated with a transistor either shifts the nominal threshold voltage or not, and that the bias of the second control gate allows adjustment of the threshold voltage.

Figure 4:
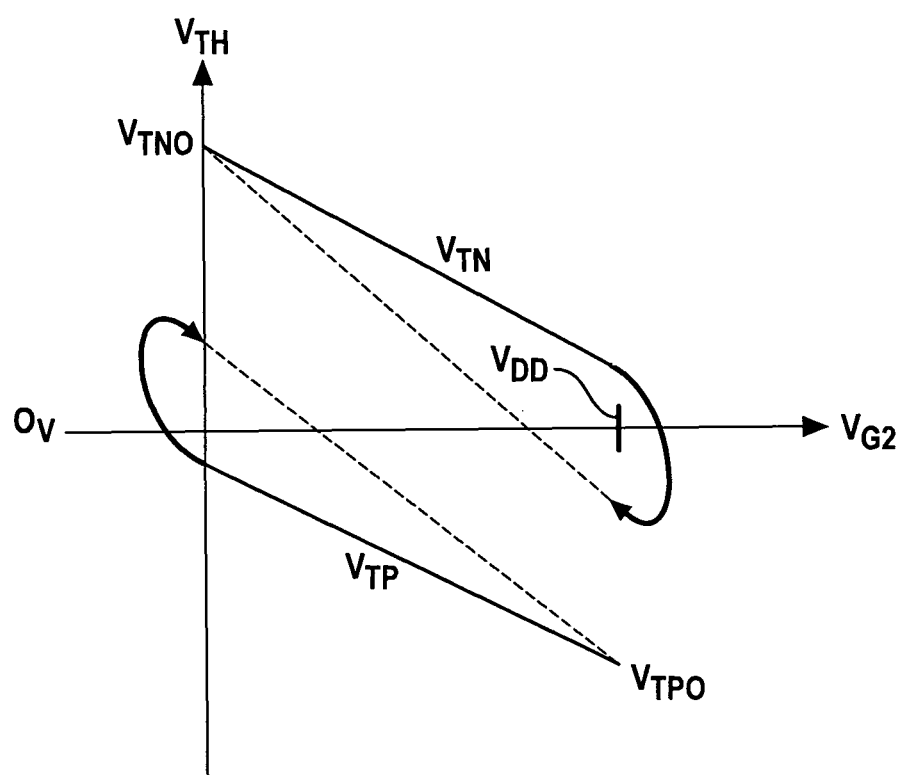
FIG. 4 illustrates the modulation of the threshold voltage of a transistor depending on the bias of its second control gate.

In this respect, FIG. 4 illustrates the modulation of the threshold voltage $V_{TH}$ of a transistor depending on the bias $V_{G2}$ of its second control gate. This bias is typically in the range 0V-VDD.

An N type transistor has a nominal threshold voltage $V_{TN0}$. The effective threshold voltage of this transistor may be reduced from the nominal threshold voltage $V_{TN0}$ by increasing the bias $V_{G2}$ of its second control gate, and this globally linearly according to a slope corresponding to the coefficient $\alpha$ related to the geometry of the transistor.

Two possible variations of the threshold voltage of an N channel transistor versus the geometry coefficient $\alpha$ are illustrated in FIG. 4, in solid lines and in dotted lines, respectively. It is noticed that it proves to be possible (cf. dotted line curve) to adopt a geometry of a transistor such that the transistor is in a depletion mode (negative threshold voltage) when a sufficiently large bias is applied to its second control gate.

A P type transistor has a nominal threshold voltage $V_{TP0}$. The effective threshold voltage of this transistor may be increased from the nominal threshold voltage $V_{TP0}$ by reducing the bias $V_{G2}$ of its second control gate, and this globally linearly according to a slope corresponding to the coefficient $\alpha$ related to the geometry of the transistor.

Two possible variations of the threshold voltage of a P channel transistor versus the geometry coefficient $\alpha$ are illustrated in FIG. 4, in solid lines and in dotted lines, respectively. It is noticed that it proves to be possible (cf. doted line curve) to adopt a geometry of a transistor such that the transistor is in a depletion mode (positive threshold voltage) when a sufficiently low bias is applied to its second control gate.

Referring back to the description of the invention, it is provided that at least one of the transistors of the circuit is configured so as to operate in a depletion mode under the action of a second gate signal which will sufficiently modulate its threshold voltage.

It may also be advantageously provided that the second control gates of the transistors $T_P$ and $T_N$ are biased by a same second gate signal (possibly with a modification of the amplitude of the second gate signal).

It will be noted at this stage that depending on the contemplated applications, transistors may be selected for which the nominal threshold voltages ($V_{TN0}$ and $V_{TP0}$) are not identical (in absolute value), so that only one of the two transistors of the circuit is capable of operating in a depletion mode. Alternatively, a second gate signal which does not have the same amplitude may also be applied to the second control gate of each of the transistors $T_P$ and $T_N$.

According to a first possible embodiment of the circuit according to the first aspect of the invention illustrated in FIG. 5, the pseudo-inverter circuit provides the logic NOR function.

In FIG. 5, the second control gates $G_{2P}$, $G_{2N}$ are biased by a same second gate signal A#. The first terminal for application of a power supply potential is biased by the complementary signal A of the second gate signal, while the second terminal for application of a power supply potential is biased at a OFF state (low state GND). The transistor of the second channel type $T_N$, as for it, is configured so as to operate in a depletion mode when the second gate signal A# is at the ON state (high state H).

It will be noted that within the claims, the term "ON state" is preferred to "high state" and the term "OFF state" is preferred to "low state" as the concept high/low is fine for the Nchannel transistor but inverted for the Pchannel transistor.

Hence ON means that the transistor is boosted and leaky. It can even be depletion if there is enough amplitude in threshold voltage modulation. OFF means that the threshold voltage of the transistor is elevated by the second gate control: the transistor has less leakage and less drive. The voltage effects by the second gate control are symmetrical for P and N channels.

The operation of the circuit of FIG. 5 is the following, depending on the high H or low L state of inputs A and B.

B=H and A=H

When the input B of the pseudo-inverter circuit is in the high state, the transistor $T_N$ is conducting while the transistor $T_P$ is blocked.

As the signal A applied to the first terminal for application of a power supply potential is high, the circuit is powered.

The complementary signal A# applied to the second gates $G_{2P}$, $G_{2N}$ is such that the transistor $T_P$ remains in an enhancement mode and is therefore blocked.

Alternatively, a transistor geometry may be adopted such that $T_P$ is in an enhancement mode when A#=0V. This alternative should of course be compatible with the properties that the transistor $T_N$ should have in the other cases.

The OUT output of the circuit is then in the low state.

B=H and A=L

As the input B of the pseudo-inverter circuit is in the high state, the transistor $T_N$ is conducting while the transistor $T_P$ is blocked.

As the signal A applied to the first terminal for application of a power supply potential is (sufficiently) low, the circuit is not powered.

As the second gate signal A# is in the high state, the transistor $T_P$ is blocked and has very low leakage current $I_{OFF}$.

As the second gate signal A# is in the high state, the transistor $T_N$ has a strong conduction current and therefore perfectly maintains a low state on the output OUT of the circuit.

B=L and A=H

As the input B of the pseudo-inverter circuit is in the low state, the transistor $T_N$ is blocked while the transistor $T_P$ is conducting.

As the signal A applied to the first terminal for application of a power supply potential is high, the circuit is powered.

The complementary signal A# applied to the second control gates is such that the transistor $T_P$ remains in an enhancement mode and is therefore conducting with strong conduction current. A high state is therefore perfectly maintained on the output OUT of the circuit.

B=L and A=L

As the input B of the pseudo-inverter circuit is in the low state, the transistor $T_N$ is blocked while the transistor $T_P$ is conducting.

As the signal A applied to the first terminal for application of a power supply potential is (sufficiently) low, the circuit is not powered.

As the second gate signal A# is in the high state, the transistor $T_P$ is blocked and has very low leakage current $I_{OFF}$. The transistor $T_N$, as for it, has very good conduction current and remains conducting insofar that its geometry is such that the transistor then operates in a depletion mode. The OUT output of the circuit is then in the low state.

The truth table of the circuit of FIG. 5 is then the following.

| B | A | A# | OUT |
|---|---|----|-----|
| H | H | L  | L   |
| H | L | H  | L   |
| L | H | L  | H   |
| L | L | H  | L   |

It will be noted that the oxide thicknesses D1, D2 separating the second control gates $G_{2P}$, $G_{2N}$ and the first control gates $G_{1P}$, $G_{1N}$ from the channel of the transistor may not the same. In such case, the inputs A and B are not equivalent: A can be a slow input while B is a relatively fast input if the thickness of the oxide layer D2 is larger than the one of D1.

Figure 2A:
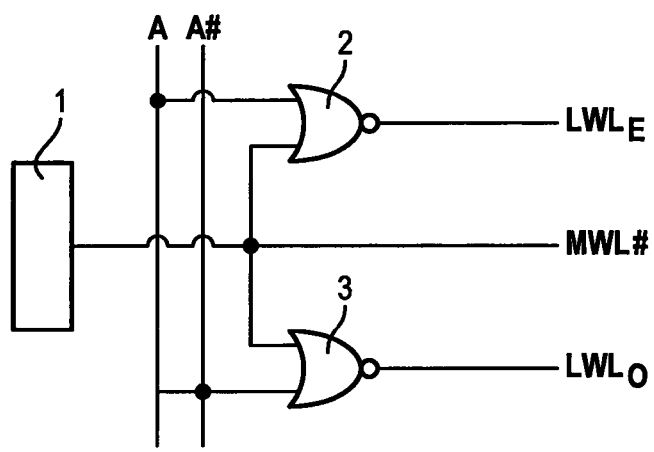
Figure 2B:
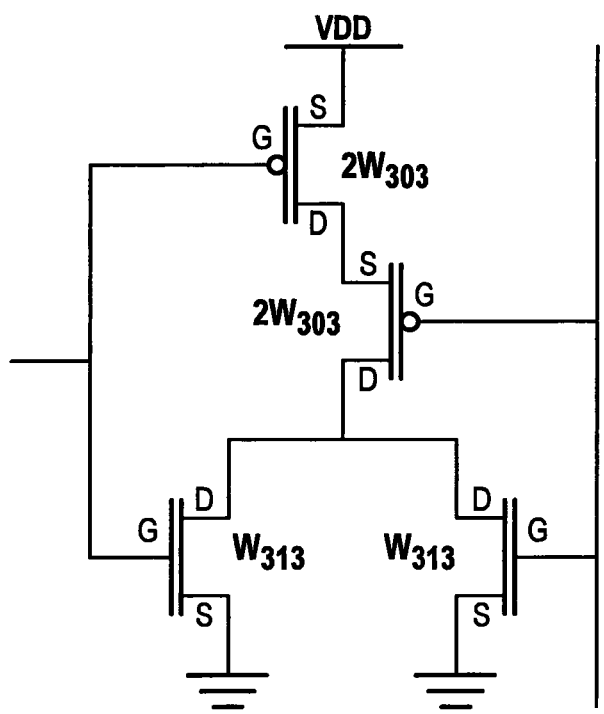

A possible application of the NOR circuit of FIG. 5 which fulfils the same logic function as the circuit of FIG. 2a, is illustrated in FIG. 6, i.e. the embodiment of two NOR gates in parallel.

In this application, a wordline driver circuit of a memory array is provided comprising at least one pair of circuits 4, 5 according to FIG. 5 laid out in parallel, each circuit of the pair being intended for receiving an input signal (main wordline signal MWL#) from a row address decoder 1 and providing at the output a signal $LWL_E$, $LWL_O$ intended to be used as a local wordline for a plurality of memory cells laid out as a line.

The control of the driver circuit illustrated in FIG. 6 is the following.

In an active mode, the second gate bias signal A# of the first circuit 4 of the pair of circuits is the complementary signal of the second gate signal A of the second circuit 5 of the pair of circuits.

In such a way that when the main wordline signal MWL# is in the high state, the first and second circuits 4, 5 both provide a low state at the output ($LWL_E$=$LWL_O$=L). On the other hand, when the main wordline signal MWL# is in the low state, the first circuit 4 provides a high state ($LWL_E$=H), whereas the second circuit 5 provides a low state ($LWL_O$=L).

In an inactive mode (standby mode), the first terminal for application of a power supply potential and the bias signals of second gates of each of the circuits of the pair are in the low state.

In the inactive mode, the main wordline signal MWL# is in the high state. The transistors $T_N$ of the circuits 4,5 are conducting whereas the transistors $T_P$ of the circuits 4, 5 are blocked.

Insofar that the first terminal for application of a power supply potential and the bias signals of the second gates of each of the circuits of the pair are in the low state, the driver circuit is not powered and therefore no leakages are observed. The outputs (local wordlines $LWL_E$ and $LWL_O$) are therefore both in the low state.

The truth table of the driver circuit of FIG. 6 is thus the following.

|  | MWL# | A | A# | LWL$_E$ | LWL$_O$ |
|---|---|---|---|---|---|
| Active mode | H | H | L | L | L |
|  | H | L | H | L | L |
|  | L | H | L | H | L |
|  | L | L | H | L | H |
| Standby mode | H | L | L | L | L |

The wordline driver circuit of FIG. 6 has the advantage of low power consumption. Indeed, in the standby mode, the driver circuit is not powered. Moreover, the driver circuit comprises a reduced number of components (only two transistors) so that in the active mode, switching is only observed for a reduced number of components.

According to a second possible embodiment of the circuit according to the first aspect of the invention illustrated in FIG. 7, the pseudo-inverter circuit provides the logic NAND function.

In FIG. 7, the second control gates $G_{2P}$, $G_{2N}$ are biased by a same second gate signal A. The first terminal for application of a power supply potential is biased at a high state VDD, whereas the second terminal for application of a power supply potential is biased by the complementary signal A# of the second gate signal. The transistor of the first channel type $T_P$ is, as for it, configured so as to operate in a depletion mode when the second gate signal A is in the low state L.

The operation of the circuit of FIG. 5 is the following depending on the high H or low L state of the inputs A and B.

B=L and A=L

The transistor $T_P$ is conducting and has strong conduction current because the second gate signal is in the low state.

The transistor $T_N$ is blocked and has few leakages (a weak leakage current because of the second gate signal in the low state). In any case, it is not powered.

The output OUT is thus in the high state.

B=H and A=L

The transistor $T_N$ is blocked and has few leakages (a weak leakage current because of the second gate signal in the low state). In any case, it is not powered.

The transistor $T_P$ is conducting insofar that it then operates in a depletion mode under the action of the second signal of the second gate in the low state.

The output OUT is thus in the high state.

B=L and A=H

The transistor $T_P$ is conducting (but not boosted because of the high state applied to the second gate signal).

The transistor $T_N$ is blocked (it is not in a depletion mode here)

The output OUT is thus in the high state.

B=H and A=H

The transistor $T_P$ is blocked (and not boosted because of the high state applied to the second gate signal).

The transistor $T_N$ is conducting (it is not in a depletion mode here)

The output OUT is thus in the low state.

The truth table of circuit of FIG. 7 is thus the following.

| B | A | A# | OUT |
|---|---|---|---|
| L | L | H | H |
| H | L | H | L |
| L | H | L | L |
| H | H | L | L |

Within the scope of the invention, the transistors $T_N$ and $T_P$ may be boosted (increase in their conduction current) when this is desired because of the bias of their second control gate.

Taking the example of the driver circuit of FIG. 6, the relatively large voltage required on the local wordline may be obtained by using transistors which globally are twice as smaller as those used in standard driver solutions.

Figure 1:
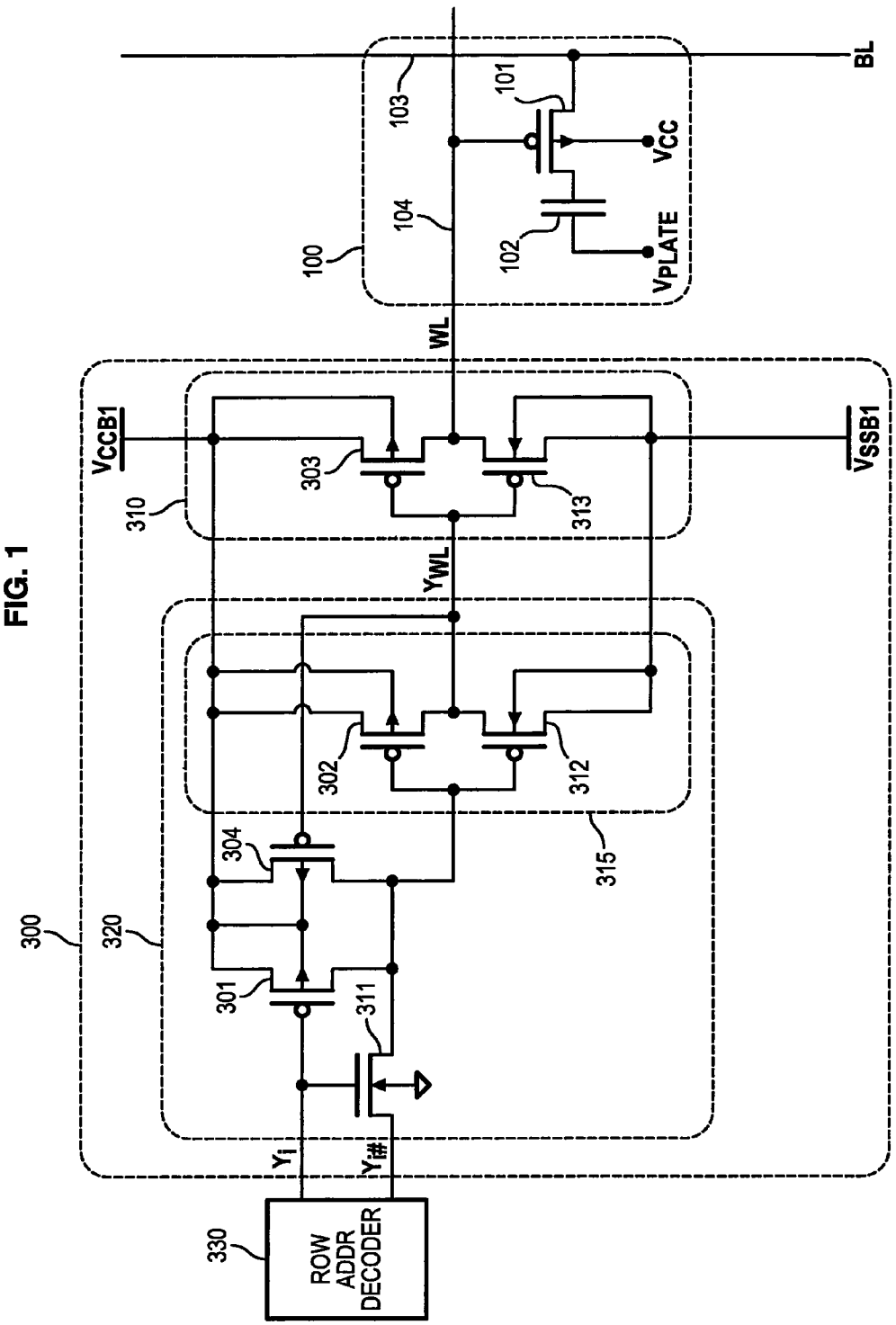

Thus, the size of the transistor $T_P$ is of the order of one third of that of the transistor 303 of FIG. 1, whereas the size of the transistor $T_N$ is of the order of one third of that of the transistor 313 of FIG. 1 (which is approximately the same as that of the transistor 303).

Thus, the driver circuit has a size globally equal to the size (W303) of the transistor 303

The solution proposed by the invention is thus much denser (by a factor of the order of four taking into account limitations relating to metallization) than those of standard driver solutions.

As indicated earlier, consumption is also reduced.

The integration of such a circuit is further simpler to apply. It does not require resorting to stacking (staggering) and facilitates the introduction of 4F$^2$ surface area memory cells by simplifying the peripheral components.

Further, an advantage of the invention is to make available a circuit which, depending on the inputs which are applied to it, may both provide logic INV, NOR and NAND functions, so that the whole of the standard library of CMOS cells may be described on the basis of the single circuit of the invention.

It will be appreciated that, notably in order to provide the logic NOR and NAND functions, the invention provides an original command of a (pseudo-) inverter by applying digital signals to the terminals for application of a power supply potential, rather than the classical 0V and VDD power supplies.

The digital signals may in particular be complementary to the second gate signal.

In this respect, the invention also relates to a system comprising at least one pseudo-inverter circuit according to its first aspect and a control circuit designed to modify the inputs provided to said at least one pseudo-inverter circuit so that the logic function provided by said at least one pseudo-inverter circuit can be changed in between the logic INV, NOR and NAND functions. The control circuit is thereby in particular designed to apply digital signal, in particular digital signals complementary to that of the second gate signal, to at least one of the terminals for application of a power supply. Of course, the control circuit may provide different inputs to the different pseudo-inverter circuits under its control potential.

What is claimed is:

1. A circuit including a transistor of a P-type channel in series with a transistor of a N-type channel between first and second terminals for applying a power supply potential, each of the transistors being a multiple gate transistor having at least first and second independent control gates, said transistor of P-type channel having a source connected to the first terminal for applying a power supply potential, and said transistor of N-type channel having a source connected to the second terminal for applying a power supply potential, wherein at least one of the transistors is configured for operating in a depletion mode under the action of a second gate signal applied to its second control gate, and wherein said circuit is configured to provide a logic NOR function, and wherein the second control gates are configured to be biased by a same second gate signal and the first terminal for application of a power supply potential is configured to be biased by the complementary signal of said second gate signal, whereas the second terminal for application of a power supply potential is configured to be biased at an OFF state.

2. The circuit according to claim 1, wherein the transistor of the N-type channel is configured in order to operate in a depletion mode when the second gate signal is in an ON state.

3. The circuit according to claim 1, including an input node connected to the first control gate of each of the transistors and an output node connected to the middle point of the serial association of the transistors.

4. The circuit according to claim 1, wherein the transistors are configured to be fully depleted.

5. The circuit according to claim 1, wherein the transistors are double independent gate FET transistors which first and second independent gates are arranged laterally each one on one side of the channel region of the transistor.

6. The circuit according to claim 1 made on a semiconductor-on-insulator substrate comprising a thin layer of semiconducting material separated from a base substrate by a buried insulating layer, wherein the first gate of each transistor is a front tri-gate surrounding all three sides of the channel of the transistor and the second control gate of each transistor is a back control gate formed in the base substrate below the channel of the transistor and separated from said channel by the buried insulating layer.

7. A system comprising at least one circuit according to claim 1 and a control circuit designed to modify the signals provided to said at least one circuit so that the logic function provided by said at least one circuit is configured to be changed in between the logic INV, NOR and NAND functions.

8. A wordline driver circuit comprising at least one pair of circuits according to claim 1 laid out in parallel, each circuit of the pair configured to receive an input signal from a row address decoder and to provide at an output a signal as a local wordline for a plurality of memory cells laid out as a row.

9. A memory incorporating a wordline driver circuit according to claim 8.

10. A method for controlling a driver circuit according to claim 8, wherein:

in an active mode, the signal for biasing the second gates of the first circuit of a pair of circuits is complementary of the signal for biasing the second gates of the second circuit of the pair of circuits;

in an inactive mode, the first terminal for application of a power supply potential and the signals for biasing the second gates of each of the circuits of the pair are in the OFF state.

11. A circuit including a transistor of a P-type channel in series with a transistor of a N-type channel between first and second terminals for applying a power supply potential, each of the transistors being a multiple gate transistor having at least a first and a second independent control gates, said transistor of P-type channel having a source connected to the first terminal for applying a power supply potential and said transistor of N-type channel having a source connected to the second terminal for applying a power supply potential, wherein said circuit is configured to provide a logic NAND function, and wherein at least one of the transistors is configured for operating in a depletion mode under the action of a second gate signal applied to its second control gate, wherein the second control gates are configured to be biased by a same second gate signal and wherein the second terminal for application of a power supply potential is configured to be biased by the complementary signal of said second gate signal, and the first terminal for application of a power supply potential is configured to be biased to an ON state.

12. The circuit according to claim 11, wherein the transistor of the P-type channel is configured in order to operate in a depletion mode when the second gate signal is in an OFF state.

13. The circuit according to claim 11, including an input node connected to the first control gate of each of the transistors and an output node connected to the middle point of the serial association of the transistors.

14. The circuit according to claim 11, wherein the transistors are configured to be fully depleted.

15. The circuit according to claim 11, wherein the transistors are double independent gate FET transistors which first and second independent gates are arranged laterally each one on one side of the channel region of the transistor.

16. The circuit according to claim 11 made on a semiconductor-on-insulator substrate comprising a thin layer of semiconducting material separated from a base substrate by a buried insulating layer, wherein the first gate of each transistor is a front tri-gate surrounding all three sides of the channel of the transistor and the second control gate of each transistor is a back control gate formed in the base substrate below the channel of the transistor and separated from said channel by the buried insulating layer.

17. A system comprising at least one circuit according to claim 11 and a control circuit designed to modify the signals provided to said at least one circuit so that the logic function provided by said at least one circuit is configured to be changed in between the logic INV, NOR and NAND functions.

* * * * *